(12) United States Patent
Kozakai et al.

(10) Patent No.: US 10,276,343 B2
(45) Date of Patent: Apr. 30, 2019

(54) METHOD FOR ACQUIRING IMAGE AND ION BEAM APPARATUS

(71) Applicant: HITACHI HIGH-TECH SCIENCE CORPORATION, Minato-ku, Tokyo (JP)

(72) Inventors: Tomokazu Kozakai, Tokyo (JP); Fumio Aramaki, Tokyo (JP); Osamu Matsuda, Tokyo (JP); Kensuke Shiina, Tokyo (JP); Kazuo Aita, Tokyo (JP); Anto Yasaka, Tokyo (JP)

(*) Notice: Subject to any disclaimer, the term of this patent is extended or adjusted under 35 U.S.C. 154(b) by 0 days.

(21) Appl. No.: 15/982,175

(22) Filed: May 17, 2018

(65) Prior Publication Data

US 2018/0269029 A1 Sep. 20, 2018

Related U.S. Application Data

(62) Division of application No. 15/279,055, filed on Sep. 28, 2016, now Pat. No. 10,014,157.

(30) Foreign Application Priority Data

Sep. 30, 2015 (JP) .................. 2015-192660

(51) Int. Cl.
*H01J 37/22* (2006.01)
*H01J 37/20* (2006.01)
(Continued)

(52) U.S. Cl.
CPC ........ *H01J 37/222* (2013.01); *H01J 37/1474* (2013.01); *H01J 37/20* (2013.01);
(Continued)

(58) Field of Classification Search
CPC .. H01J 37/00; H01J 37/02; H01J 37/08; H01J 37/22; H01J 37/222; H01J 37/224;
(Continued)

(56) References Cited

U.S. PATENT DOCUMENTS

| 2007/0221843 A1 | 9/2007 | Ward ..................... B82Y 10/00 250/309 |
| 2008/0302962 A1 | 12/2008 | Takahashi ............ G01N 23/225 250/310 |

(Continued)

FOREIGN PATENT DOCUMENTS

JP 63307728 12/1988

*Primary Examiner* — Jason L McCormack
(74) *Attorney, Agent, or Firm* — Adam & Wilks

(57) ABSTRACT

A method of acquiring an image of an image acquiring region of a sample comprises a first step of irradiating and scanning an ion beam in a first scan pattern on a first scan region of a sample, the scan region including therein the image acquiring region, and a second step of detecting secondary charged particles generated by irradiating and scanning the ion beam on the first scan region of the sample and generating first image data of the image acquiring region. The first and second steps are repeated a plurality of times using different scan patterns on different scan regions that differ from the first scan and the first scan region and from one another, each of the different scan regions including therein the image acquiring region, to generate a plurality of image data of the image acquiring region. Image data of the image acquiring region are generated by synthesizing all the image data generated by scanning the different scan region, and the synthesized image data of the image acquiring region are displayed on a display unit.

6 Claims, 15 Drawing Sheets

(51) Int. Cl.
*H01J 37/28* (2006.01)
*H01J 37/147* (2006.01)

(52) U.S. Cl.
CPC ........... *H01J 37/28* (2013.01); *H01J 2237/20* (2013.01); *H01J 2237/202* (2013.01); *H01J 2237/2067* (2013.01); *H01J 2237/226* (2013.01); *H01J 2237/2806* (2013.01); *H01J 2237/2817* (2013.01)

(58) Field of Classification Search
CPC ........ H01J 37/226; H01J 37/228; H01J 37/26; H01J 37/261; H01J 37/28
USPC ....... 250/306, 307, 309, 492.1, 192.2, 492.3
See application file for complete search history.

(56) References Cited

U.S. PATENT DOCUMENTS

| | | | | |
|---|---|---|---|---|
| 2009/0032723 | A1* | 2/2009 | Fukaya | H01J 37/026 250/397 |
| 2012/0057015 | A1* | 3/2012 | Ward | H01J 37/265 348/80 |
| 2013/0068949 | A1 | 3/2013 | Urano | H01J 37/153 250/310 |

* cited by examiner

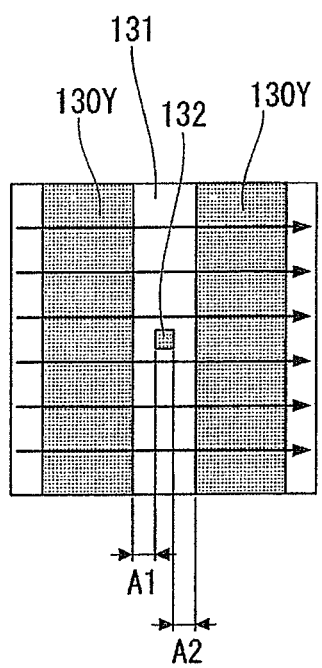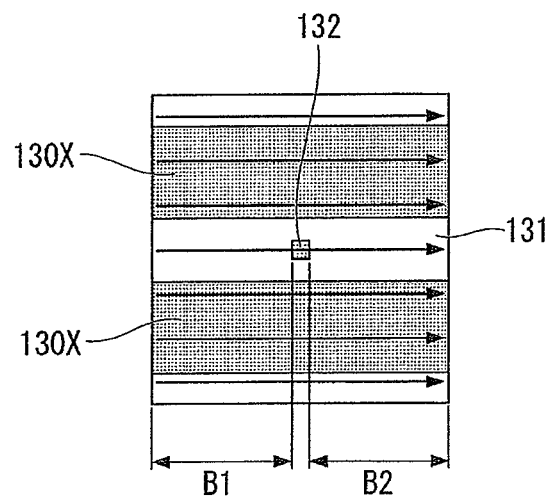
(PRIOR ART)
FIG 14A
(PRIOR ART)
FIG 14B

METHOD FOR ACQUIRING IMAGE AND ION BEAM APPARATUS

CROSS REFERENCE TO RELATED APPLICATIONS

This application is a divisional of U.S. application Ser. No. 15/279,055 filed Sep. 28, 2016, which claims the benefit of Japanese Application No. 2015-192660 filed Sep. 30, 2015, which is hereby incorporated by reference, and priority thereto for common subject matter is hereby claimed.

BACKGROUND OF THE INVENTION

1. Technical Field

The present invention relates generally to a method for acquiring an image, and an ion beam apparatus.

2. Description of the Related Art

A process of scanning and sweeping an ion beam across a target (a sample), in which a conductor is present on an insulator, to observe or process the sample is used for many applications. For example, there is repair of a mask used to produce a semiconductor device and so on.

The mask has a mask pattern of a conductive material such as a metal on a transparent dielectric substrate such as a glass. The mask screens light in a shape of the mask pattern. The mask pattern has an isolated pattern or the like in which striped lines and spaces arranged vertically and horizontally, or small rectangles are present. In this way, the shape of the mask pattern mostly has pattern edges in all directions. The repair of the mask does not remake a front surface of the expensive mask when there are defects or the like in a pattern of the mask, but repairs only the defects or the like, which is advantageous from an economical and temporal standpoint.

In the repair of the mask, an ion beam is scanned and swept across the pattern edge of the mask in a horizontal or orthogonal direction.

As a similar technology, for example, an X-ray mask examination device for scanning and sweeping across an X-ray mask to acquire or examine (observe) an image is described in Patent Literature 1. It is also described in the X-ray mask examination device that an electron beam is scanned across a pattern edge of a line shape in an orthogonal direction or is scanned and swept across a rectangular mask pattern in a parallel or orthogonal direction.

PRIOR ART LITERATURE

Patent Literature (Patent Literature 1) Japanese Unexamined Patent Application Publication No. S63-307728

SUMMARY OF THE INVENTION

However, the conventional image acquiring method and the conventional ion beam apparatus have problems as follows.

When the sample in which the conducting part is present on the insulator is observed or processed by the ion beam, sometimes a shape or a size of the image acquired by the ion beam cannot be accurately determined. In this case, one factor is that the insulating part on scan and sweep regions of the ion beam is charged by scan and sweep. Since the wider an area of the insulating part surrounding the conducting part to be observed, the more an amount of electrification, and since the scanned and swept ion beam is influenced by charged electric charges, the conducting part approximates a minute conducting part such as a defect, and thus a deformed image is acquired, or no image is acquired.

FIGS. 14A and 14B are top views illustrating an example of a sample in which a conducting part is present on an insulator and a scan direction of an ion beam in a related art. In FIG. 14A, within an observation field of view, a plurality of metal line patterns (conductors) 130Y extending in a shown longitudinal direction are formed on a glass panel 131 acting as an insulator at an interval in a shown transverse direction. An exposure part of the glass panel 131 extends between the side-by-side metal line patterns 130Y in the longitudinal direction. An isolated metal pattern (a conductor) 132 having a smaller contour than line widths of the metal line patterns 130Y exists between the neighboring metal line patterns 130Y. For example, the isolated metal pattern 132 may be a normal pattern, a defect of the mask, or the like. In any case, to examine or repair the pattern, images corresponding to contours of the metal line patterns 130Y and the isolated metal pattern 132 need to be accurately acquired.

FIG. 14B illustrates a state of an observation field of view of another region. FIG. 14B is different from FIG. 14A only in that the patterns extend in a shown longitudinal direction. That is, within the observation field of view, two metal line patterns 130X extending in a transverse direction are formed, and an isolated metal pattern 132 is formed on a glass panel 131 between the metal line patterns 130X.

To acquire an image of each observation field of view, scan and sweep of an ion beam are performed. A scan direction of the ion beam is a transverse direction (see a shown thin arrow) directed from the shown left side toward the shown right side. A sweep direction of the ion beam is a longitudinal direction directed from the shown upper side toward the shown lower side.

In the case of a field of view range of FIG. 14A, the ion beam scanned over the isolated metal pattern 132 is scanned in a direction perpendicular to the extending direction of the metal line patterns 130Y. For this reason, the ion beam is radiated to the insulating part only by a length corresponding to transverse distances A1 and A2 between the isolated metal pattern 132 and the metal line patterns 130Y on the glass panel 131.

In the case of a field of view range of FIG. 14B, the ion beam scanned over the isolated metal pattern 132 is scanned in the extending direction of the metal line patterns 130X. For this reason, the ion beam is radiated to the insulating part only by a length corresponding to transverse distances B1 and B2 between the isolated metal pattern 132 and left and right ends of the field of view range on the glass panel 131.

In the two figures, since the length by which the ion beam is radiated to the insulating part has a relationship of (A1+A2)<(B1+B2), the amount of electrification of the glass panel 131 is more in FIG. 14B. For this reason, in the example of FIG. 14A, an image of the isolated metal pattern 132 can be clearly acquired, whereas, in the example of FIG. 14B, the image of the isolated metal pattern 132 is deformed or dislocated. When the amount of electrification is considerable, or when the isolated metal pattern 132 is small, sometimes the image of the isolated metal pattern 132 cannot be acquired at all.

In this way, when the ion beam is scanned and swept across the region where the conductive isolated pattern is present on the insulating part, there is a great difference between the isolated patterns that can be acquired by an expanding direction of the insulating part surrounding the isolated pattern and the scan direction of the ion beam. If presence or a shape of the isolated pattern cannot be accurately recognized, this causes a problem that interferes with examination or processing based on the ion beam apparatus.

Accordingly, the present invention has been made keeping in mind the above problems, and an object of the present invention is to provide a method for acquiring an image and an ion beam apparatus that is capable of easily acquiring an image in which an influence of charges on a dielectric substrate is reduced when an image of the dielectric substrate in which a conducting part having a linear edge is formed is acquired using an ion beam.

In order to accomplish the above object, a method for acquiring an image of a first aspect of the present invention acquires an image of an image acquiring region by radiating an ion beam to a sample having conducting parts with linear edges on a dielectric substrate, and includes: a first operation of performing an equal-width scan caused by the ion beam in a first direction that obliquely intersects the edges and sweep in a second direction intersecting the first direction, and radiating the ion beam to a scan region of a parallelogram shape wider than the image acquiring region; a second operation of detecting secondary charged particles generated by radiating the ion beam to generate image data of the scan region; a third operation of calculating the image data of the scan region to generate image data of the image acquiring region; and a fourth operation of displaying the image data of the image acquiring region.

In the method for acquiring the image, the first operation may be performed a plurality of times by changing at least one of a scan direction of the equal-width scan and a sweep direction of the sweep and setting output of the ion beam such that a total amount of irradiation of the ion beam in the image acquiring region becomes an amount of irradiation required when an image is acquired by one sweep; the second operation may be performed after the first operation is performed each of the plurality of times; and the third operation may synthesize a plurality of image data that are generated by the second operation performed a plurality of times and are based on the image data in the scan region, and thereby generates the image data of the image acquiring region.

The method for acquiring the image may further include: before the plurality of image data based on the image data in the scan region are synthesized in the third operation, a fifth operation of detecting an amount of position offset between the image data in the scan region that is generated by the second operation performed at least the first of the plurality of times in which the second operation is performed and the image data in the scan region that is generated by the second operation performed the final times; and a sixth operation of correcting a plurality of amounts of position offset of the image data in the scan region on the basis of the amount of position offset detected by the fifth operation.

An ion beam apparatus of a second aspect of the present invention includes: an ion beam column configured to generate an ion beam used to acquire an image of an image acquiring region of a dielectric substrate on which conducting parts with linear edges are formed and radiate the ion beam to the dielectric substrate; a movable stage configured to support the dielectric substrate to be movable within at least a plane intersecting an optical axis of the ion beam column; an ion beam irradiation control device configured to control the ion beam column to perform an equal-width scan caused by the ion beam in a first direction that obliquely intersects the edges and sweep in a second direction intersecting the first direction and radiate the ion beam to a scan region of a parallelogram shape wider than the image acquiring region; a detector configured to detect secondary charged particles generated from the dielectric substrate when the ion beam is radiated; an image data generator configured to generate image data of the scan region on the basis of detected output of the detector; a storage configured to store the image data of the scan region; a calculator configured to calculate the image data of the scan region to generate image data of the image acquiring region; and a display unit configured to display the image data of the image acquiring region.

In the ion beam apparatus, the ion beam irradiation control device may cause the ion beam column to radiate the ion beam a plurality of times by changing at least one of a scan direction of the equal-width scan and a sweep direction of the sweep and setting output of the ion beam such that a total amount of irradiation of the ion beam on the image acquiring region becomes an amount of irradiation required when an image is acquired by one sweep; and the calculator may synthesize a plurality of image data that are generated by the image data generator whenever the ion beam is radiated a plurality of times and are based on the image data in the scan region, and thereby generates the image data of the image acquiring region.

In the ion beam apparatus, the calculator may be configured to: detect an amount of position offset between the image data in the scan region that is generated at least first among the plurality of image data in the scan region and the image data in the scan region which is generated finally; and correct a plurality of amounts of position offset of the image data in the scan region on the basis of the amount of position offset.

According to the method for acquiring the image and the ion beam apparatus of the present invention, there is exerted an effect that, when the image of the dielectric substrate on which the conducting parts with the linear edges are formed is acquired using the ion beam, the image reducing the influence of the electrification of the dielectric substrate can be easily acquired.

BRIEF DESCRIPTION OF THE DRAWINGS

The above and other objects, features and advantages of the present invention will be more clearly understood from the following detailed description taken in conjunction with the accompanying drawings, in which:

FIGS. 14A and 14B are top views illustrating an example of a sample in which a conducting part is present on an insulator and a scan direction of an ion beam in a related art.

DESCRIPTION OF THE PREFERRED EMBODIMENTS

Hereinafter, embodiments of the present invention will be described in detail with reference to the accompanying drawings. In all the drawings, even in the case of different embodiments, the same or equivalent members will be given the same symbols, and common description thereof will be omitted.

First Embodiment

A method for acquiring an image and an ion beam apparatus of a first embodiment of the present invention will be described.

Figure 1:
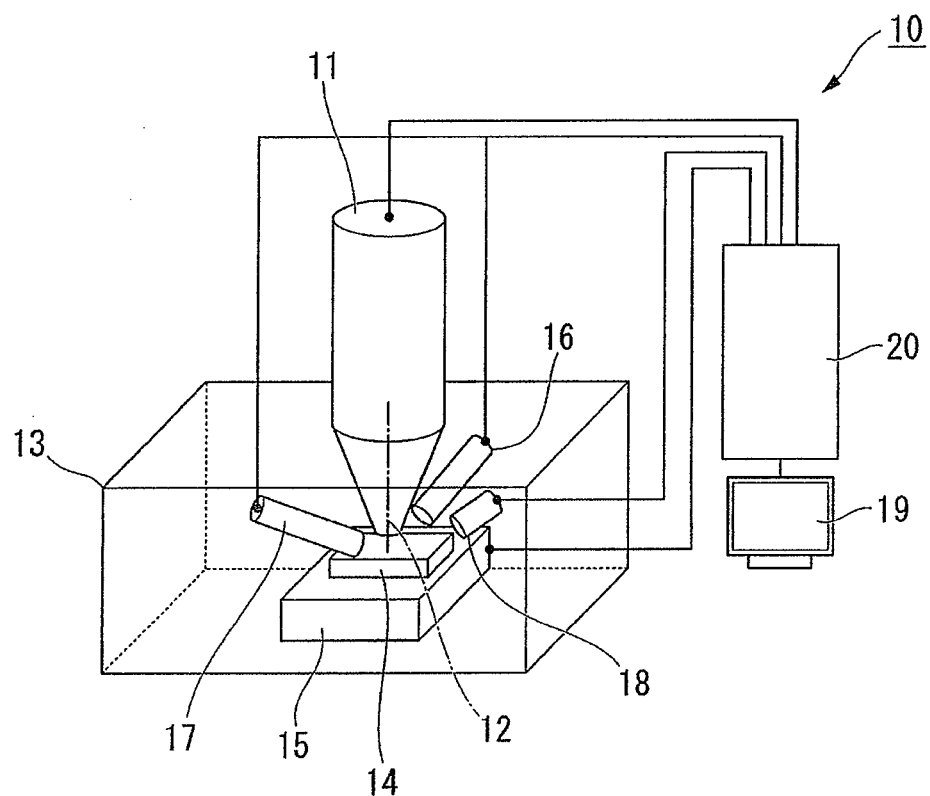
FIG. 1 is a schematic system configuration view illustrating an example of a configuration of an ion beam apparatus of a first embodiment of the present invention.
Figure 1:
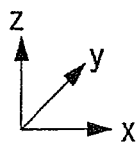

FIG. 1 is a schematic system configuration view illustrating an example of a configuration of an ion beam apparatus of a first embodiment of the present invention.

An ion beam apparatus 10 of the present embodiment illustrated in FIG. 1 radiates an ion beam to a sample having a metal pattern on a substrate formed of an insulating material such as a glass panel, and performs processing of the metal pattern. An example of the processing performed by the ion beam apparatus 10 may include, for instance, repair of a photomask used in fabricating a semiconductor device, and so on. The ion beam apparatus 10 repairs a defect of a mask using, for instance, sputtering etching, gas-assisted etching, or gas-assisted deposition. To perform this repair, the ion beam apparatus 10 can acquire an image of a surface of a sample according to the method for acquiring the image of the present embodiment.

The ion beam apparatus 10 can detect a defect of the metal pattern from the acquired image, and perform the repair on the defect.

The ion beam apparatus 10 is provided with a sample chamber 13, a sample stage (a movable stage) 15, an ion beam column 11, a detector 18, an etching gas feeder 16, a deposition gas feeder 17, a monitor (a display unit) 19, and a control device 20.

The sample chamber 13 has a mask (a sample) 14 that is housed therein and is repaired by the ion beam apparatus 10. A vacuum exhaust device (not shown) is connected to the sample chamber 13, so that a degree of vacuum inside the sample chamber 13 can be changed.

The sample stage 15 movably maintaining the mask 14 is disposed in the sample chamber 13. The ion beam column 11 radiating an ion beam toward the sample stage 15 is disposed in the sample chamber 13 at a position facing the sample stage 15. In the present embodiment, the ion beam column 11 is disposed such that an optical axis 12 of an ion beam optics is parallel to a vertical axis.

The sample stage 15 has a loading surface within a plane intersecting a direction in which the ion beam is radiated from the ion beam column 11. The mask 14 is placed on the loading surface of the sample stage 15. The sample stage 15 supports the placed mask 14 to be movable at least within the plane intersecting the direction in which the ion beam is radiated.

In the ion beam apparatus 10 illustrated in FIG. 1, as an example, the sample stage 15 can independently move along two axes (hereinafter referred to as X and Y axes) that are orthogonal to each other in a horizontal plane.

A direction orthogonal to the X and Y axes is defined as a Z axis. In the present embodiment, the Z axis of the sample stage 15 is coaxial with the optical axis of the ion beam optics. However, for the purpose of easy viewing, the Z axis of FIG. 1 is depicted at a position deviating from the optical axis.

The sample stage 15 may have a degree of movement freedom in addition to translation motions following the X and Y axes.

In the present embodiment, the sample stage 15 is made up of a 5-axis movement mechanism configured of a combination of an XYZ-axial stage, a tilt state, and a rotary stage, which are not shown. The XYZ-axial stage translates each axis direction of the aforementioned X, Y, and Z axes. The tilt stage obliquely moves around the aforementioned X or Y axis. The rotary stage rotates about the above Z axis.

In the present embodiment, the sample stage 15 is communicatably connected with the control device 20 to be described below. The sample stage 15 is operated by an operation instruction that is input from an operator through an input unit (not shown) or the monitor 19. Further, the sample stage 15 may be operated according to an operation instruction that the control device 20 (to be described below) generates as needed.

The ion beam column 11 generates the ion beam, and radiates the ion beam toward the mask 14 on the sample stage 15.

In the present embodiment, the ion beam apparatus 10 performs the repair of the mask.

The ion beam column 11 is provided with an ion source that generates ions, a lens that focuses the ions generated from the ion source, a deflector that scans and sweeps the ion beam over a sample surface, an iris that passes a part of the ion beam, and so on. However, illustration of their known internal structures are omitted in FIG. 1.

A type of the ion source is not limited as long as the ion source can focus the ions on a minute diameter to form the ion beam. The ion source preferably has high focusability of the ion beam because an image, in which the higher the focusability of the ion beam, the more excellent the image resolution, is obtained.

An example of the ion source that can be adequately used for the ion beam column 11 may include, for instance, a gas field ion source, a liquid metal ion source, a plasma ion source, and so on.

The deflector deflects the ion beam within a plane orthogonal to the optical axis of the ion beam optics focusing the ions. For this reason, the deflector can scan and also sweep the ion beam within a scan plane (a plane intersecting an optical axis of the lens) in an arbitrary direction.

The ion beam column 11 is communicatably connected with the control device 20 to be described below. An ion beam current value, a scan direction or velocity of the ion beam, and a sweep direction or velocity of the ion beam are set for the ion beam column 11 on the basis of a control signal from the control device 20. The ion beam column 11 performs a scan and sweep operation according to these setting values.

The detector 18 detects secondary charged particles generated when the ion beam from the ion beam column 11 is radiated to the sample. In the present embodiment, the secondary charged particles detected by the detector 18 are at least one of secondary ions and secondary electrons.

The detector 18 is obliquely disposed above the sample stage 15 in the sample chamber 13. The detector 18 is communicatably connected with the control device 20 to be described below. The detector 18 transmits the detected output to the control device 20.

When selective removal repair of the conducting part such as the metal pattern on the mask 14 is performed, the etching gas feeder 16 accelerates etching caused by the irradiation of the ion beam, and feeds a gas (an etching gas) that selectively removes a specific place on the sample.

An example of the etching gas may include, for instance, a halogen-based gas such as iodine.

The etching gas feeder 16 is communicatably connected with the control device 20 to be described below. The etching gas feeder 16 feeds the etching gas on the basis of the control signal from the control device 20.

When the metal pattern on the mask 14 is formed or is repaired to recover a loss thereof, the deposition gas feeder 17 feeds a gas (a deposition gas) that forms a deposition film at a specific position on the sample by radiating the ion beam. An example of the deposition gas may include, for instance, a carbon-based gas, a silane-based gas, and a carbon-based compound gas containing a metal such as tungsten.

A film formed of, for instance, carbon, silicon oxide, platinum, or tungsten can be formed on the mask 14 by radiating an ion beam of nitrogen or the like while spraying the deposition gas from the deposition gas feeder 17 at a repair place on the mask 14. As a result, the mask in which a defect does not transfer the defect despite exposure, can normally transfer a pattern.

The monitor 19 is communicatably connected with the control device 20 to be described below. The monitor 19 displays an image based on image information transmitted from the control device 20.

An image based on image data of an image acquiring region of the mask 14 that is obtained from the detected output of the detector 18 by the method for acquiring the image of the present embodiment to be described below is included in the image information transmitted from the control device 20.

Example of other images that the monitor 19 displays may include a screen (an operation input screen) that inputs operation conditions for operating constituent portions of the ion beam apparatus 10 such as the ion beam column 11, the sample stage 15, and so on, and a screen that shows an operation state of the ion beam apparatus 10.

The control device 20 controls an operation of each constituent portion of the ion beam apparatus 10.

The control device 20 at least performs control of a repair operation of the mask 14 (hereinafter referred to simply as repair operation) and a control of an image acquiring operation of the mask 14 (hereinafter referred to simply as image acquiring operation) based on the ion beam.

For example, the control device 20 controls operations of the ion beam column 11 and the etching gas feeder 16, thereby performing removal repair using the ion beam. As a result, in comparison with the case in which the etching gas is not introduced, high-speed processing of the mask pattern is possible, or only a desired material can be selectively removed.

For example, the control device 20 controls operations of the ion beam column 11 and the deposition gas feeder 17 to perform deposition repair using the ion beam.

The ion beam is radiated while spraying an organic metal gas of platinum, tungsten, or the like from the deposition gas feeder 17 over the mask 14, thereby elements of the gas component can be deposited. For example, the ion beam is radiated while spraying a carbon gas of pylene, naphthalene, phenanthrene, or the like, or a silane-based gas of tetramethylcyclotetrasiloxanes (TMCTS) or the like from the deposition gas feeder 17 over the defect part of the metal pattern, thereby cut parts can be recovered with a carbon film or a silicon oxide layer.

In any case of the repair operation and the image acquiring operation, the control device 20 performs display control of the monitor 19. The control device 20 displays the operation input screen on the monitor 19, and receives operation input of an operator into the ion beam apparatus 10 through the operation input screen.

The control device 20 controls the operations of the ion beam column 11, the detector 18, and the monitor 19, thereby performing the image acquiring operation. The image acquiring operation is based on the method for acquiring the image of the present embodiment to be described below.

Hereinafter, primary function components of the control device 20 related to the image acquiring operation will be described in brief with reference to FIG. 2.

Details associated with an operation of each function component will be described in the overall operations of the ion beam apparatus 10 to be described below.

Figure 2:
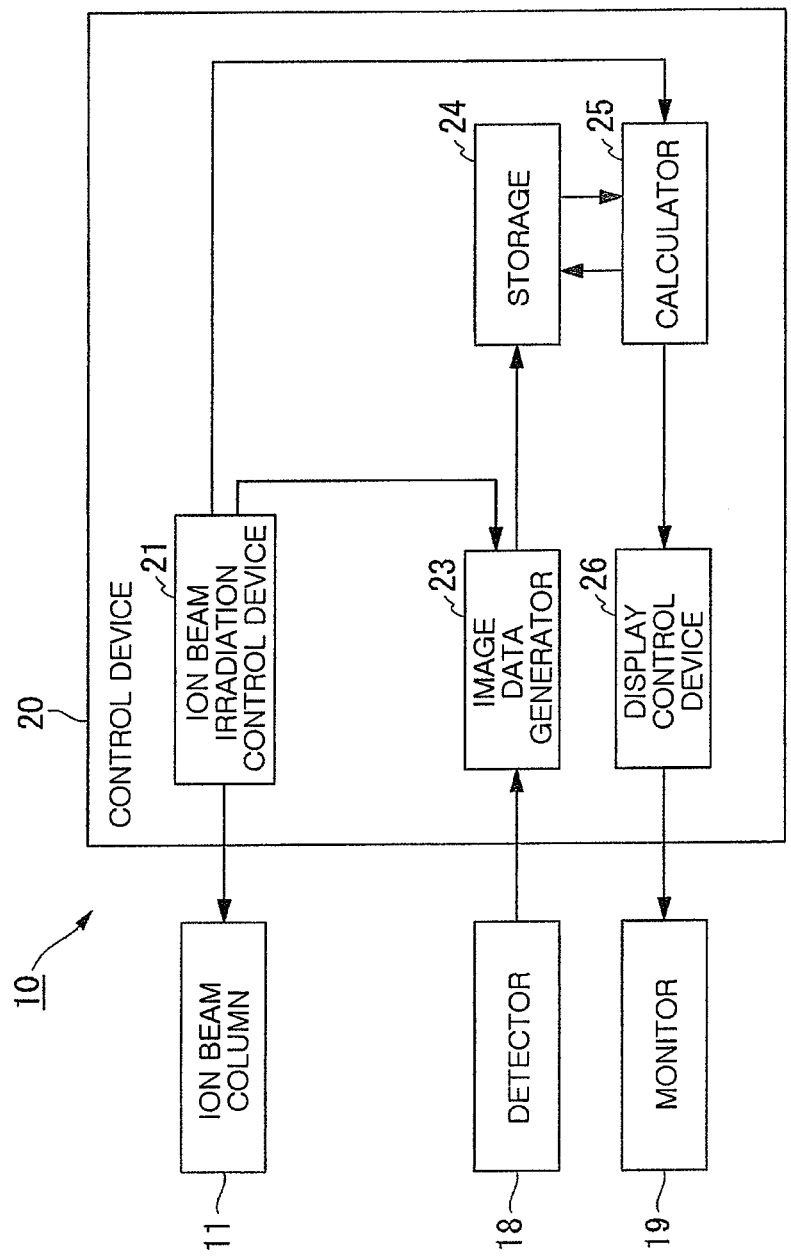
FIG. 2 is a block diagram illustrating primary function components of a control device of the ion beam apparatus of the first embodiment of the present invention.

FIG. 2 is a block diagram illustrating the primary function components of the control device of the ion beam apparatus of the first embodiment of the present invention.

As illustrated in FIG. 2, the control device 20 is provided with an ion beam irradiation control device 21, an image data generator 23, a storage 24, a calculator 25, and a display control device 26.

The ion beam irradiation control device 21 controls an ion beam radiating operation of the ion beam column 11, synchronizes with the ion beam radiating operation, and controls operations of the respective constituent portions within the ion beam apparatus 10.

For this reason, the ion beam irradiation control device 21 is communicatably connected to the ion beam column 11, the image data generator 23, and the calculator 25.

In the image acquiring operation, the ion beam irradiation control device 21 sets a scan region of the ion beam.

Figure 3:
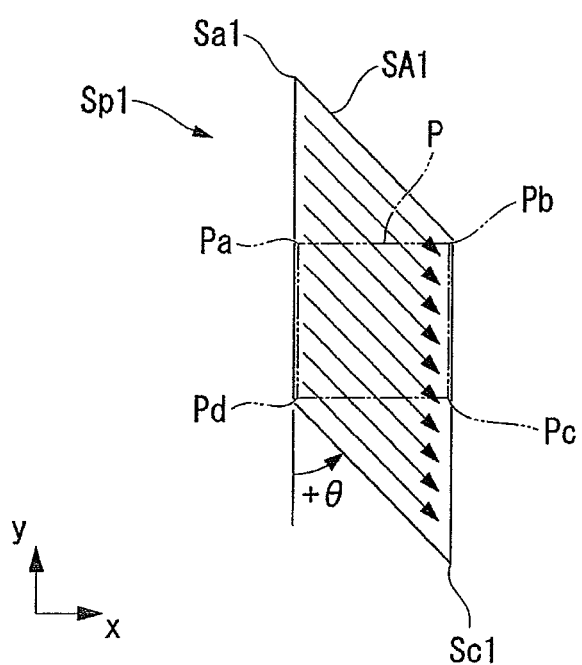
FIG. 3 is a schematic view illustrating an example of an image acquiring region and a scan region based on the ion beam apparatus of the first embodiment of the present invention.

FIG. 3 is a schematic view illustrating an example of an image acquiring region and a scan region based on the ion beam apparatus of the first embodiment of the present invention.

As illustrated in FIG. 3, an image acquiring region P is a rectangular region displayed on the monitor 19 in the mask 14. The image acquiring region P is of a rectangle having points Pa, Pb, Pc, and Pd as vertexes. The points Pa, Pb, Pc, and Pd are disposed in this order in a shown clockwise direction. Hereinafter, an axis parallel to a side between the points Pa and Pb (or a side between the points Pd and Pc) is defined as an x axis, and an axis parallel to a side between the points Pd and Pa (or a side between the points Pc and Pb) is defined as a y axis.

The x and y axes correspond to deflecting directions of the two axes of the ion beam column 11.

A scan region SA1 of the ion beam is of a parallelogram having points Sa1, Pb, Sc1, and Pd with vertexes. The point Sa1 is a point adjacent to the point Pa on a linear extension line passing through the points Pd and Pa. The point Sc1 is a point adjacent to the point Pc on a linear extension line passing through the points Pb and Pc.

An intersecting angle at which a side between the Pd and Sc1 (or a side between the points Sa1 and Pb) is made with the y axis is +θ (where 0°<θ<90°) when measured from the y axis. Here, a sign of the intersecting angle is the positive sign in a shown counterclockwise direction and the negative sign in a shown clockwise direction.

The image acquiring region P may be of a square or a rectangle. When the image acquiring region P is of the square, the intersecting angle θ is set to, for instance, 45°.

When the image acquiring region P is of the rectangle, a contour of the scan region SA1 may be of a rhombus that is a type of parallelogram.

As indicated by a shown arrow, the scan direction of the ion beam on the scan region SA1 is a direction directed the point Sa1 toward the Pb. For this reason, each scan line of the ion beam obliquely intersects the x and y axes.

Since each scan line is parallel to the side between the points Sa1 and Pb, lengths (scan widths) of the scan lines are identical to each other.

The sweep direction of the ion beam on the scan region SA1 is a direction following the y axis. For example, the sweep direction may be a direction directed from the point Sa1 toward the point Pd or in the opposite direction.

A scan pattern in which the inside of the aforementioned scan region SA1 is scanned directed from the point Sa1 toward the point Pb is defined as a scan pattern Sp1.

As will be described below, in the present embodiment, the ion beam irradiation control device 21 further sets three scan regions in addition to the scan region SA1. The scan direction of the ion beam is reversed on each scan region, and thereby seven types of scan patterns (to be described below) are obtained in addition to the scan pattern Sp1.

The ion beam irradiation control device 21 controls the scan and the sweep operation of the ion beam on the basis of eight types of scan patterns.

The ion beam irradiation control device 21 controls the ion beam current value determining output of the ion beam in each scan pattern. In the present embodiment, the ion beam current value can be set to a proper value through the operation screen of the ion beam apparatus 10 on the basis of an amount of irradiation (a dose) of the ions that an operator properly sets according to a type of the mask 14 or the like. The ion beam current value can be properly set according to a type of the scan pattern or the number of scan patterns.

An ion beam current of each scan pattern is set as follows. Through experience, an operator can determine the amount D of irradiation (a dose or the number of ions per unit area) of the ion beam for obtaining a good image on a region that is not originally influenced by charging. When D is equally set to each of the plurality of scan patterns, the amount of irradiation of the ion beam is excessive on the scan and sweep region. For this reason, an ion beam current capacity and the number of sweeps are set such that an amount d of irradiation of the ion beam for each scan pattern has a value given by dividing D by the number N (where N=8) of scan patterns.

In the present embodiment, settable scan patterns and current values I according to a type of the mask 14 are previously stored in the ion beam irradiation control device 21.

In the present embodiment, the number N of scan patterns used as a default is 8.

The ion beam irradiation control device 21 controls the deflector such that the ion beam is scanned from a start point toward an end point in each scan pattern, and blanks the scan of the ion beam when one scan line reaches the end point. The blanking refers to perform deflection control such that the ion beam does not reach the sample for a time from the end of the scan of one scan line to the start of the scan of the next scan line.

After the blanking, the ion beam irradiation control device 21 scans the ion beam with the scan width that is parallel and identical to a first scan line from a new start point that is slightly displaced from a position of a first start point in a sweep direction. The ion beam irradiation control device 21 repeats this control, thereby performing the scan and sweep operation of the ion beam on the entirety of one region.

The ion beam irradiation control device 21 notifies the image data generator 23 (to be described below) of a timing of the start of the scan of the first scan line and a timing of the end of the scan of the last scan line in each scan pattern.

When the scan and the sweep are completed in all the scan patterns for acquiring the image of the image acquiring region P, the ion beam irradiation control device 21 notifies the calculator 25 (to be described below) that all of the scans and the sweeps are completed.

The image data generator 23 is communicatably connected to the detector 18, the ion beam irradiation control device 21 (to be described below), and the storage 24.

The image data generator 23 receives detected output from the detector 18. Timings of the start and end of the scan of one scan pattern are notified to the image data generator 23 from the ion beam irradiation control device 21. The image data generator 23 generates image data on the basis of the detected output from the start to the end of the scan of one scan pattern. For this reason, the image data generator 23 generates image data (hereinafter referred to as scan region image data) on each of the scan regions in each of the plurality of scan patterns.

The image data generator 23 stores each of the generated scan region image data in the storage 24.

The calculator 25 is communicatably connected to the ion beam irradiation control device 21, the storage 24, and the display control device 26.

When it is notified from the ion beam irradiation control device 21 that all of the scans and the sweeps are completed, the calculator 25 begins to generate the image data of the image acquiring region P.

The calculator 25 analyzes a series of scan region image data associated with one image acquiring region P stored in the storage 24, and detects an amount of position offset between the scan region image data. If necessary, the calculator 25 corrects the amount of position offset in the scan region image data.

The calculator 25 synthesizes each of the scan region image data after the amount of position offset is corrected as needed, and extracts the image data (referred to as image acquiring region image data) on the image acquiring region P from the synthesized scan region image data.

The calculator 25 transmits the extracted image acquiring region image data to the display control device 26.

In the image acquiring operation, the display control device 26 displays the image acquiring region image data transmitted from the calculator 25 on the monitor 19.

A device configured of the control device 20 is a computer made up of a central processing unit (CPU), a memory, an input/output interface, an external memory, etc., and thus a proper control program for generating a control signal as described above is executed.

Next, an operation of the ion beam apparatus 10 will be described centered on an operation relevant to the method for acquiring the image of the present embodiment.

Figure 4:
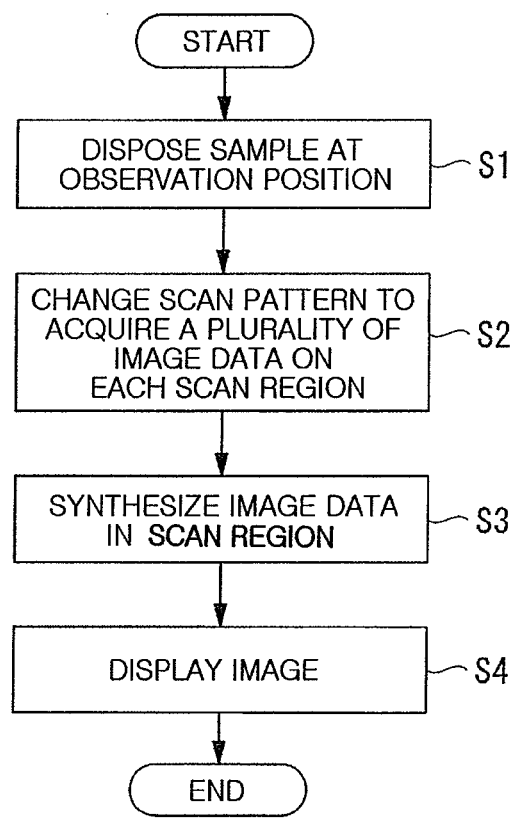
FIG. 4 is a flow chart illustrating a flow of a method for acquiring an image of the first embodiment of the present invention.

FIG. 4 is a flow chart illustrating a flow of the method for acquiring the image of the first embodiment of the present invention.

Steps S1 to S4 shown in FIG. 4 are performed to acquire the image of the mask 14 by the ion beam apparatus 10.

Step S1 is a step including an operation of disposing the mask 14 acting as the sample at an observing position.

An operator disposes the mask 14 on the sample stage 15. The operator performs operation input from the monitor 19 to position the mask 14 with respect to the ion beam column 11.

Here, an example in which the mask 14 is arranged will be described.

Figure 5:
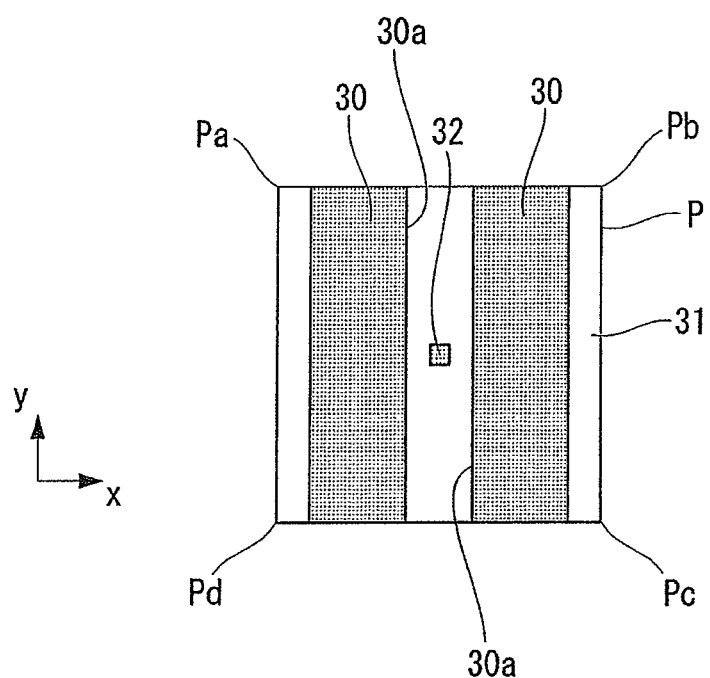
FIG. 5 is a schematic top view illustrating an example of a substrate, an image of which is acquired by the ion beam apparatus of the first embodiment of the present invention.

FIG. 5 is a schematic top view illustrating an example of a substrate, an image of which is acquired by the ion beam apparatus of the first embodiment of the present invention. However, FIG. 5 illustrates a state of a surface within the image acquiring region P out of the surface of the mask 14.

As illustrated in FIG. 5, various mask patterns are formed on the surface of the mask 14 according to use of the mask 14.

As illustrated in FIG. 5, a line-and-space pattern is formed at a part of the mask 14 by a plurality of metal line patterns (conduction patterns or conducting parts) 30 that are parallel to each other on a glass panel (an insulating part or a dielectric substrate) 31. The metal line patterns 30 are the conducting parts, and a region interposed between the metal line patterns 30 is an insulating part (a space) to which the glass panel 31 is exposed.

Edges 30a, each of which extends along a boundary with the insulating part in a linear shape, are formed at opposite ends of each of the metal line pattern 30 in a line width direction.

An isolated pattern (a conduction pattern or a conducting part) 32 separated from each of the metal line patterns 30 is formed on the insulating part. The isolated pattern 32 is a normal pattern or a defect formed without intention.

When an image including the metal line patterns 30 as illustrated in FIG. 5 is acquired, the mask 14 is disposed such that the edges 30a are parallel to the x or y axis of the image acquiring region P. In FIG. 5, as an example, the edges 30a are disposed to be parallel to the y axis.

In a certain case, the metal line patterns 30 are bent on another region in view of pattern design at an angle of 90° or 45°. In this case, a bent region and a bent direction are known in advance. An extending direction of each of the metal line patterns 30 has a previously known positional relationship with respect to the contour of the mask 14 or an alignment mark formed within the mask 14.

First, an operator fits the contour or the alignment mark of the mask 14 in a proper direction with respect to an array reference on the XY plane of the sample stage 15, and places the mask 14 on the sample stage 15. Then, the operator adjusts the sample stage 15 by rotation about the Z axis to be matched with the x or y axis of a previously known deflecting direction of the ion beam.

Afterwards, the operator drives the sample stage 15 to perform Z-axial positioning such that the surface of the mask 14 is located at a previously known focal plane of the ion beam column 11 or fitting a focus of the ion beam to the surface of the mask.

Then, the operator displaces the sample stage 15 within the XY plane, and displaces a region for observing the mask 14 directly below an observing position of the ion beam.

In this way, the mask 14 is located at the observing position as illustrated in FIG. 5.

Since the metal line patterns 30, each of which has a rectangular shape with right-angled portions, mainly occupy a mask used to fabricate a semiconductor, when some of the metal line patterns 30 are positioned to be parallel to the y axis, the other metal line patterns extending in a direction perpendicular to the positioned metal line patterns are positioned to be parallel to the x axis.

Unless specifically mentioned, the following description will made with an example in which an image within the image acquiring region P illustrated in FIG. 5 is acquired.

When step S1 is completed, step S2 is performed as illustrated in FIG. 4.

This step is a step including an operation of changing the scan pattern to acquire a plurality of image data on each scan region.

Prior to describing a detailed operation of this step, the scan pattern used in the present embodiment will be described.

FIGS. 6A, 6B, and 6C, and FIGS. 7A, 7B, 7C, and 7D are schematic views illustrating an example of the scan pattern in the method for acquiring the image of the first embodiment of the present invention.

Figure 6A:
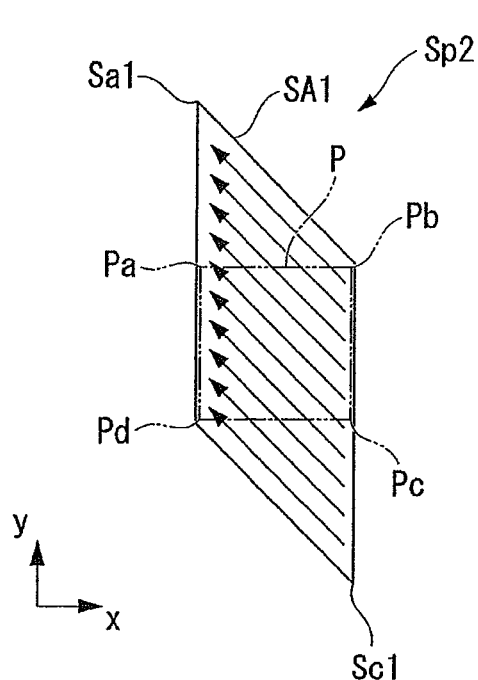
FIGS. 6A to 6C are schematic views illustrating an example of a scan pattern in the method for acquiring the image of the first embodiment of the present invention.

A scan pattern Sp2 illustrated in FIG. 6A is different from the scan pattern Sp1 (see FIG. 3) only in that the scan direction of the ion beam is reversed. In the scan pattern Sp2, a scan direction is a direction directed from a point Pb toward a point Sa1.

Figure 6B:
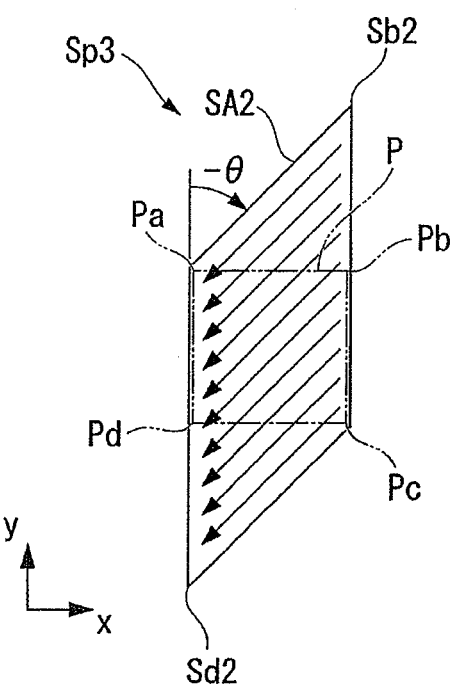

A scan pattern Sp3 illustrated in FIG. 6B is a scan pattern equivalent to reversing the scan pattern Sp1 to shown left and right (in an x-axial direction).

A scan region SA2 of the scan pattern Sp3 is a parallelogram having points Pa, Sb2, Pc, and Sd2 as vertexes. The point Sb2 is a point adjacent to the point Pb on a linear extension line passing through the points Pc and Pb. The point Sd2 is a point adjacent to the point Pd on a linear extension line passing through the points Pa and Pd.

An intersecting angle at which a side between the points Pa and Sb2 (or a side between the points Sd2 and Pc) is made with the y axis is $-\theta$ when measured from the y axis.

The scan direction of the ion beam is a direction directed from the point Sb2 to the point Pd, as depicted by a shown arrow.

Figure 6C:
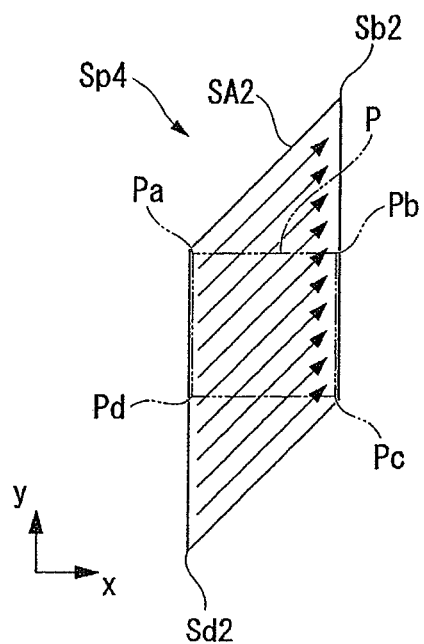

A scan pattern Sp4 illustrated in FIG. 6C is different from the scan pattern Sp3 only in that the scan direction of the ion beam is reversed.

The scan pattern Sp4 is a scan pattern equivalent to reversing the scan pattern Sp2 to be shown left and right (in an x-axial direction).

Figure 7A:
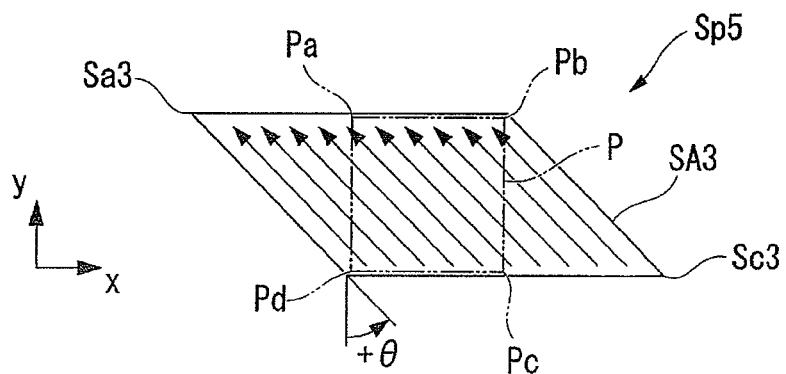
FIGS. 7A to 7D are schematic views illustrating an example of a scan pattern in the method for acquiring the image of the first embodiment of the present invention.

A scan pattern Sp5 illustrated in FIG. 7A is a scan pattern equivalent to the scan pattern Sp4 that is rotated 90° in a counterclockwise direction.

A scan region SA3 of the scan pattern Sp5 is a parallelogram having points Sa3, Pb, Sc3, and Pd as vertexes. The point Sa3 is a point adjacent to the point Pa on a linear extension line passing through the points Pa and Pb. The point Sc3 is a point adjacent to the point Pc on a linear extension line passing through the points Pd and Pc.

An intersecting angle at which a side between the points Sa3 and Pd (or a side between the points Pb and Sc3) is made with the y axis is $+\theta$ when measured from the y axis.

The scan direction of the ion beam is a direction directed from the point Pd to the point Sa3, as depicted by a shown arrow.

Figure 7B:
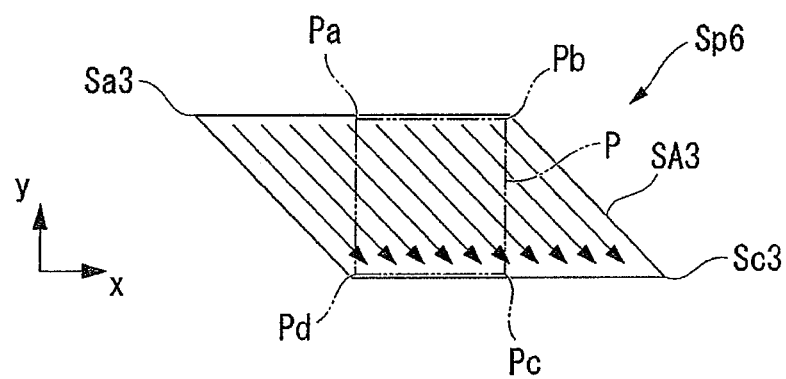

A scan pattern Sp6 illustrated in FIG. 7B is different from the scan pattern Sp5 only in that the scan direction of the ion beam is reversed.

Figure 7C:
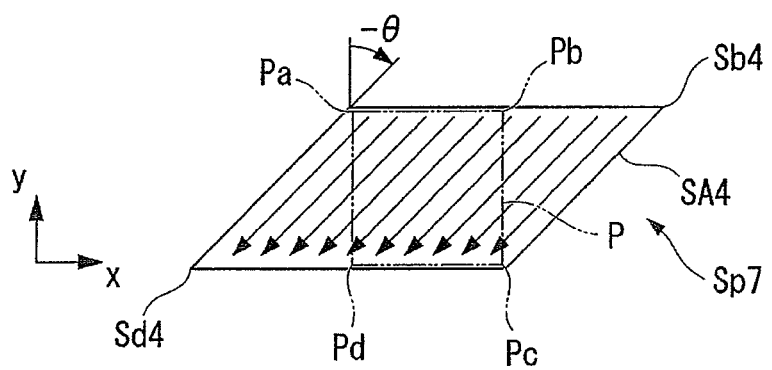

A scan pattern Sp7 illustrated in FIG. 7C is a scan pattern equivalent to the scan pattern Sp6 that is reversed to be shown from top and bottom (in a y-axial direction).

A scan region SA4 of the scan pattern Sp7 is a parallelogram having points Pa, Sb4, Pc, and Sd4 as vertexes. The point Sd4 is a point adjacent to the point Pd on a linear extension line passing through the points Pc and Pd. The point Sb4 is a point adjacent to the point Pb on a linear extension line passing through the points Pa and Pb.

An intersecting angle at which a side between the points Sa3 and Pd (or a side between the points Pb and Sc3) is made with the y axis is $-\theta$ when measured from the y axis.

The scan direction of the ion beam is a direction directed from the point Sd4 to the point Pa, as depicted by a shown arrow.

Figure 7D:
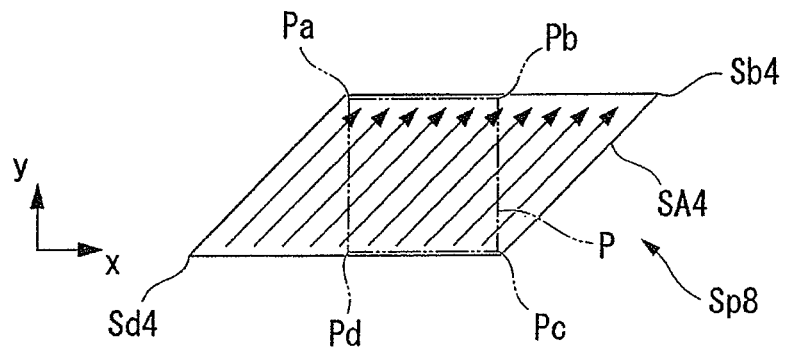

A scan pattern Sp8 illustrated in FIG. 7D is different from the scan pattern Sp7 only in that the scan direction of the ion beam is reversed.

Here, an overlapping method of each scan pattern will be described.

Figure 8:
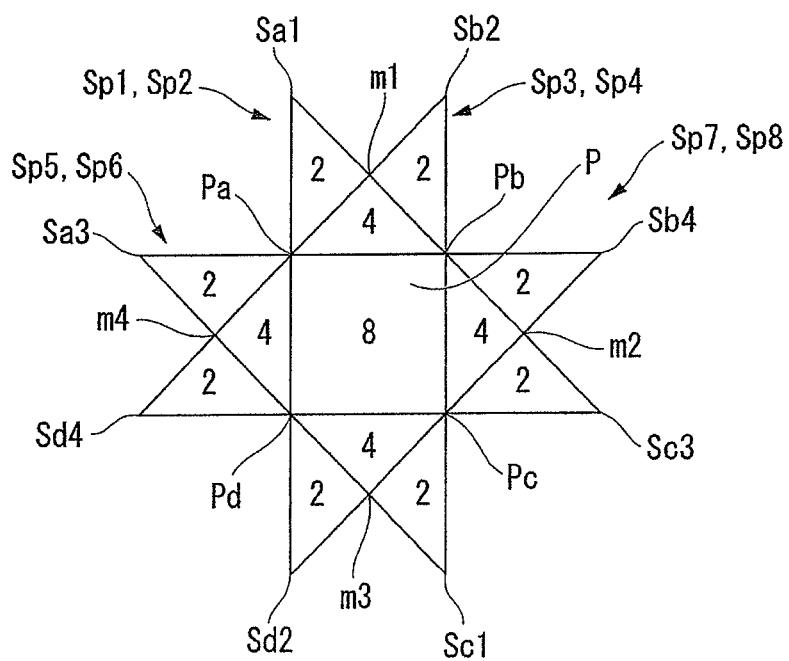
FIG. 8 is a schematic view illustrating an overlapping method of the scan pattern in the method for acquiring the image of the first embodiment of the present invention.

FIG. 8 is a schematic view illustrating an overlapping method of the scan pattern in the method for acquiring the image of the first embodiment of the present invention.

As illustrated in FIG. 8, all of the scan patterns Sp1 to Sp8 are provided to cover all the image acquiring region P. To this end, a total of eight types of scan patterns overlap on the image acquiring region P. Each number given within the figure indicates the number of overlapped scan patterns. Triangular regions (e.g., a triangle having points Pa, Pb, and m1 as vertexes, and so on) on which four types of scan patterns overlap are formed outside the image acquiring region P in four places, and triangular regions (e.g., a triangle having points Sa1, Pa, and m1 as vertexes, and so on) on which two types of scan patterns overlap are formed outside the image acquiring region P in eight places.

In this way, in the present embodiment, the image acquiring region P is multiply scanned and swept across a maximum of eight types of scan patterns in multiple directions by the ion beam. However, since the regions other than the image acquiring region P have low scan and sweep overlap of the ion beam, damage to the sample surface caused by the irradiation of the ion beam is low.

In step S2, the order of scanning and sweeping the scan patterns Sp1 to Sp8 is not particularly restricted. Hereinafter, the scan and the sweep are carried out in the order of the scan patterns Sp1 to Sp8 by way of example.

This step is initiated when an operator designates the image acquiring region through the monitor 19 and performs operation input for beginning to acquire an image, and when the control device 20 receives this operation input.

In this operation input, the operator may designate a pattern, an intersecting angle at which the ion beam is scanned, a type of the scan pattern, the number of scan patterns, and a current value of the ion beam.

If there is no designation of the operator, the ion beam irradiation control device 21 of the control device 20 sets the use of the scan patterns Sp1 to Sp8 as a default. Further, the ion beam irradiation control device 21 automatically sets the current value of the ion beam in each of the scans and the sweeps.

First, the ion beam irradiation control device 21 transmits an operation instruction based on the scan pattern Sp1 to the ion beam column 11. Simultaneously, the ion beam irradiation control device 21 notifies the image data generator 23 to initiate the scan and the sweep.

The ion beam column 11 scans and sweeps the ion beam over the mask 14 on the basis of the scan pattern Sp1.

Here, a first direction that is the scan direction of the ion beam is a direction directed from the point Sa1 toward the point Pb on the scan region SA1. A second direction that is the sweep direction of the ion beam is a direction of the y axis. The second direction obliquely intersects the first direction.

When the ion beam is radiated to the mask 14, secondary charged particles, for instance, secondary electrons are emitted from an irradiator.

When the detector 18 detects the secondary charged particles, the detector 18 transmits detected output to the image data generator 23 in turn.

The image data generator 23 notified to initiate the scan and the sweep begins to generate image data on the basis of the detected output transmitted from the detector 18.

The ion beam is scanned and swept over a target region.

If there is an insulating part on an irradiating region, the insulating part is charged. Some of charged electric charges are diffused through the neighboring conducting part during blanking, so that the charged electric charges are reduced. The longer a blanking time, the smaller an amount of electrification. However, if the blanking time is indefinitely long, this is not preferable because a time to observe or process a desired region is increased. In contrast, if the blanking time is short, electrification is overlapped by next scan of the ion beam in a state in which previous electrification is not reduced, and the amount of electrification is increased. Further, when the blanking time is not uniform whenever the ion beam is scanned or when a scanning time of the ion beam is different for each scan line, the electrification becomes non-uniform on an entire image forming region, and a stain occurs at an acquired image. For this reason, it is important to control the ion beam such that the scan is performed with the same width by setting a fixed scanning time and a fixed blanking time that are suitable for a predetermined region.

Therefore, when the image acquiring region is a rectangle (or a square), a parallelogram having oblique sides inclined with respect to one side of the rectangle and two sides adjacent to the one side becomes an optimum shape.

When the scan and the sweep based on the scan pattern Sp1 are completed, the ion beam irradiation control device 21 notifies the image data generator 23 of the completion of the scan and the sweep.

The image data generator 23 notified of the completion of the scan and the sweep completes generation of the image data. The generated image data is image data of a range of the scan region SA1 based on the scan pattern Sp1. Hereinafter, the image data is referred to as scan region image data Gs1. The image data generator 23 stores the scan region image data Gs1 in the storage 24.

In this way, acquiring the scan region image data Gs1 based on the first scan and sweep is completed.

After the scan region image data Gs1 is stored, the ion beam irradiation control device 21 performs the same control as the foregoing except that the scan pattern Sp2 is replaced with the scan pattern Sp1.

In the present embodiment, when the scan and the sweep based on one scan pattern are completed, and the storage of the scan region image data caused by the image data generator 23 is completed, the ion beam irradiation control device 21 immediately performs control for next scan and sweep.

When the scan and the sweep based on the scan pattern Sp8 are completed by repeating this operation, scan region image data Gs1 to Gs8 are stored in the storage 24.

When the scan and the sweep of the scan pattern Sp8 are completed, the ion beam irradiation control device 21 notifies the calculator 25 that all of the scans and the sweeps are completed.

Now, step S2 is completed.

After step S1 is carried out, the edges 30a of each of the metal line patterns 30 are aligned to be parallel to the y axis.

For this reason, the scan and sweep operation based on each scan pattern in step S2 includes a first operation of performing equal-width scan in a first direction that obliquely intersects the edges 30a and sweep in a second direction that intersects the first direction and of radiating the ion beam to a scan region that has a parallelogram shape and is wider than the image acquiring region P.

Further, the sweep of one scan pattern may be performed once or a plurality of times.

Further, the first operation is performed by changing at least one of a scan direction of the equal-width scan and a sweep direction of the sweep and setting a current value of the ion beam and the number of sweeps such that a total amount of irradiation of the ion beam on the image acquiring region P becomes an amount of irradiation that is used for obtaining an image suitable for a region having nearly the same area and which an operator or a control device knows in advance.

A second operation is performed at each time after the first operation performed a plurality of times.

Further, the second operation of generating scan region image data Gs1 by detecting secondary charged particles generated by radiating the ion beam is included in step S2.

Here, before step S3 is described, scan and sweep effects in step S2 will be described.

Figure 9A:
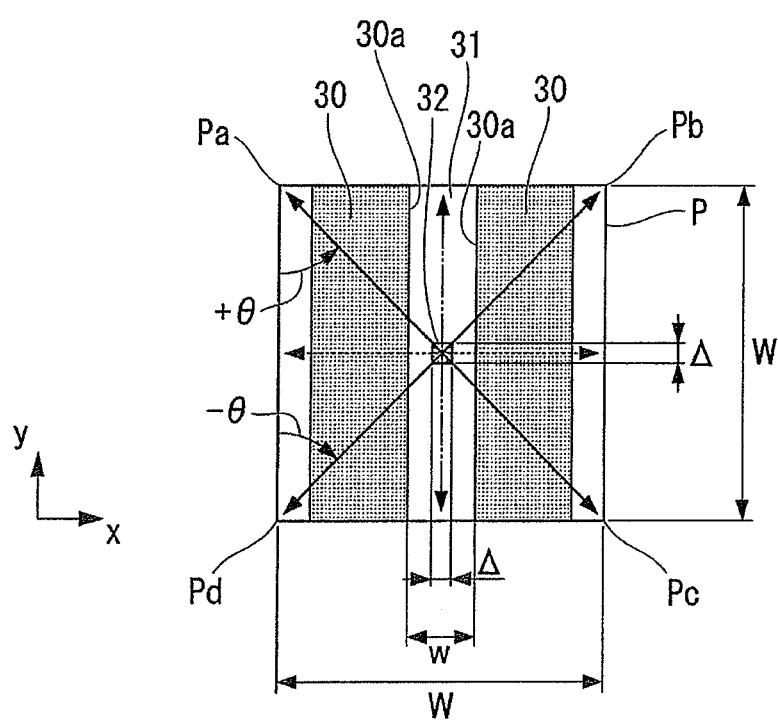
FIGS. 9A and 9B are schematic views illustrating scan and sweep effects in the method for acquiring the image of the first embodiment of the present invention.
Figure 9B:
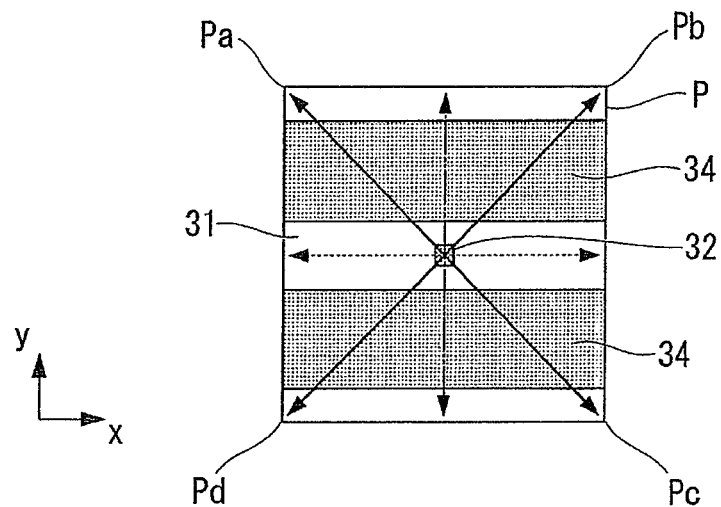

FIGS. 9A and 9B are schematic view illustrating scan and sweep effects in the method for acquiring the image of the first embodiment of the present invention.

Each of the scans and the sweeps in step S2 is performed on the basis of the scan patterns Sp1 to Sp8. As in the scan direction depicted in FIG. 9A by a solid arrow, in any case, the scan direction is obliquely intersected at an intersecting angle ±θ with respect to the y axis on the image acquiring region P. For this reason, the edge 30a extending in the y-axial direction that is the first direction is obliquely intersected at an intersecting angle ±θ.

The ion beam that scans the isolated pattern 32 crosses the edges 30a of one of the neighboring metal line patterns 30, passes through the surface of the glass panel 31 that is the insulating part, and reaches the isolated pattern 32. The ion beam passing through the isolated pattern 32 comes out of the isolated pattern 32, passes through the surface of the glass panel 31, crosses the edges 30a of the other of the neighboring metal line patterns 30, and reaches the metal line pattern 30.

The insulating part of the mask 14 is charged when scanned with the ion beam. The charged electric charges are reduced depending on the blanking time, but they are left to some extent.

To make it difficult for the ion beam to be influenced by the left charged electric charges, it is necessary to reduce as much as possible a distance at which the ion beam passes through the insulating part before and after the ion beam passes through the conducting part.

In the case of FIG. 9A, the distance at which the ion beam passes through the insulating part can be minimized in the scan line passing through the isolated pattern 32. This is to select the scan direction following the x axis (see an arrow with a shown broken line).

In contrast, as depicted by an arrow with a shown chain double-dashed line, the scan line passing through the isolated pattern 32 in the scan direction following the y axis is scanned over the insulating part except that it passes through the isolated pattern 32 acting as the conducting part. When the isolated pattern 32 is a micro pattern, the distance at which the ion beam passes through the insulating part is nearly equal to a width of the image acquiring region P in the y-axial direction.

For this reason, the influence of the charged electric charges of the insulating part is increased, so that an image of the isolated pattern 32 is deformed or cannot be checked.

In the embodiment, since an intersecting angle between the edge 30a and the scan line is ±45°, the distance at which the ion beam passes through the insulating part is about 1.4 times, in comparison with the case in which the scan direction is the x-axial direction.

For example, a line interval of the metal line pattern 30 is defined as w, a length of each side of the image acquiring region P is defined as W (where W>w), a size of each side of the isolated pattern 32 is defined as Δ (where Δ<w). Since the distance at which the ion beam passes through the insulating part in the scan direction of the shown broken line is w−Δ, the distance at which the ion beam passes through the insulating part in each scan direction of the present embodiment becomes 1.4×(w−Δ). In contrast, the distance at which the ion beam passes through the insulating part in the scan direction of the shown chain double-dashed line is W−Δ. For this reason, if 1.4×w<W, the distance at which the ion beam passes through the insulating part is sharply reduced in the case of the scan of the present embodiment. The condition can be satisfied by properly setting the size of the image acquiring region P for the metal line patterns 30.

In this way, as in the present embodiment, the ion beam is scanned in a direction inclined with respect to the y axis. Thereby, in comparison with the case in which the scan direction is the y-axial direction, it is possible to reduce the influence of the charged electric charges.

The scan pattern of the present embodiment is preferable above all when the conducting parts extending in the y-axial direction and the conducting parts extending in the x-axial direction are mixed within one mask 14.

FIG. 9B illustrates an example of a case in which, metal line patterns (conduction patterns or conducting parts) 34 extending in the x-axial direction are present as the image acquiring region P.

In this case, for the same reason as described above, the influence of the charged electric charges becomes the maximum when the scan direction is the x-axial direction (see an arrow with a shown broken line). For example, if the scan direction is optimized for the metal line patterns 30 and is selected in the x-axial direction in FIG. 9A, it is impossible to acquire a good image on the image acquiring region P as in FIG. 9B. For this reason, there is a need to examine directions of the patterns of the conducting parts on each image acquiring region P, and to change the scan direction as a result.

However, according to the present embodiment, in any case of FIGS. 9A and 9B, the influence of the charged electric charges is small, and further is admitted to the same extent. For this reason, it is possible to omit the step of examining the directions of the patterns of the conducting parts in detail to set the scan direction, and easily acquire a good image. As a result, it is possible to reduce a work time required for the observation of the image.

Further, in the present embodiment, an amount of irradiation of the ion beam in one scan pattern is set to 1/N of an amount D of irradiation of the ion beam required when an image is originally acquired by one scan and sweep.

When a current value (or a dose) of the ion beam radiated in this way is reduced, an amount of detection of the secondary charged particles is reduced. Thus, a contrast of the image is reduced to a certain extent.

However, since an amount of electrification in the scan and the sweep based on one scan pattern is reduced, the influence of the charged electric charges on the ion beam in the insulating part is reduced.

That is, each scan region image data becomes image data that more fully reproduces arrangement of the conducting parts despite a low contrast.

Next to step S2, step S3 is performed. This step is a step including an operation of synthesizing the image data based on the scan region image data Gs1 to Gs8.

This step is initiated by the calculator 25 when it is notified from the ion beam irradiation control device 21 that all of the scans and the sweeps are completed.

In this step, the calculator 25 may perform an operation (a fifth operation) of detecting an amount of position offset, an operation (a sixth operation) of correcting the amount of position offset, and an operation (a third operation) of synthesizing an image in this order.

In the operation of detecting the amount of position offset, the calculator 25 detects an amount of position offset of the scan region image data Gs8 generated by final scan and sweep from the scan region image data Gs1 generated by the first scan and sweep that is at least performed in step S2.

As described above, in the present embodiment, the charged electric charges per scan and sweep are small. However, since the scan and the sweep are repeated, the charged electric charges are gradually accumulated on the surface of the mask 14. For this reason, depending on an amount of accumulation of the charged electric charges, the ion beam that scans and sweeps the image acquiring region P has a chance of being bent on the whole under the influence of the charged electric charges. As a result, a position of the generated scan region image data is sometimes drifted (position-offset) within the xy plane. Further, in some cases, the acquired image deviates due to mechanical micromotion such as drift of the sample stage.

Figure 10:
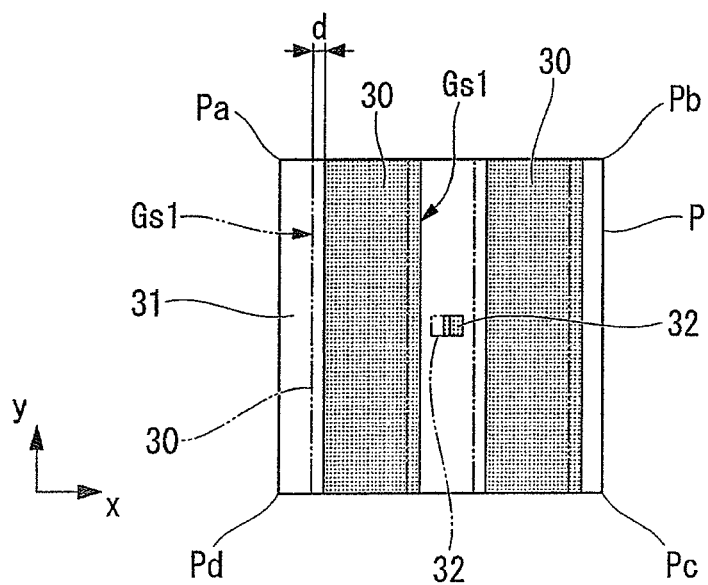
FIG. 10 is a schematic view illustrating an example of a position-offset image.

FIG. 10 is a schematic view illustrating an example of a position-offset image.

For example, in an example of the image illustrated in FIG. 10, the scan region image data Gs8 is parallel displaced relative to the scan region image data Gs1 depicted by a chain double-dashed line in a positive direction of the x axis (to a shown right side) by a distance d on the whole.

This position offset of the image is one example. An amount of position offset (a size and a direction) is different depending on an amount of electrification of the mask 14, a mask pattern of the mask 14, an amount of irradiation of the ion beam, or the like.

The calculator 25 detects an amount of relative position offset by comparison between the scan region image data.

To be specific, in the present embodiment, the amount of position offset of the image in the xy plane is detected by specifying positions of characteristic portions representing the same spots between the scan region image data.

The characteristic portion of the scan region image data that is used for the detection of the amount of position offset may include an edge, a corner, etc. which can be regarded to have no defects. The scan region image data of the present embodiment has high shape reproducibility because the influence of the charged electric charges is low. However, the amount of position offset may be detected by, particularly, extracting a shape of the defect portion.

Further, the amount of position offset of the image may be detected by some of the characteristic portions of the scan region image data as well as image matching of the entire image within the image acquiring region P.

The amount of position offset detected by image comparison between the scan region image data Gs8 caused by the final scan and sweep and the scan region image data Gs1 has a high possibility that magnitude thereof becomes maximum. Hereinafter, this amount of position offset is referred to as an amount of whole position offset.

The amount of position offset detected by the calculator 25 is not limited to the amount of overall position offset.

For example, a plurality of amounts of position offset may be detected by image comparison among the scan region image data Gs8, one of the scan region image data Gs2 to Gs7, and the scan region image data Gs1.

Hereinafter, an amount of position offset caused by the image comparison between one of the scan region image data Gs2 to Gs7 and the scan region image data Gs1 is referred to as an amount of partial position offset.

In the present embodiment, the calculator 25 detects only the amount of whole position offset as an example. The amount of position offset of the edge that can be regarded to be normal as the characteristic portion of the image data is obtained. For example, in the case of FIG. 10, an amount d of movement in the positive direction of the x axis of the edge 30a in the scan region image data Gs1 and Gs8 is detected as the amount of whole position offset.

In the operation of correcting the amount of position offset, if necessary, the calculator 25 corrects the amounts of position offset of the scan region image data Gs1 to gs8 on the basis of the amount of positional offset detected by the operation of detecting the amount of positional offset. In the present embodiment, since the amount of positional offset of the scan region image data Gs1 that becomes a reference of the amount of positional offset is regarded to be 0 (zero), no correction is performed.

In the operation of detecting the amount of positional offset, when only the amount of whole position offset is detected, the calculator 25 corrects the amount of position offset for each scan region image data by distributing an amount of whole detection as the amount of position offset of each scan region image data. A method of the distribution may be proportionally distributed, or be non-linearly distributed according to a change characteristic of the position offset when the change characteristic of the position offset is known.

In the operation of detecting the amount of positional offset, when one or more amounts of partial position offset are detected, the calculator 25 calculates the amount of position offset of each scan region image data on the basis of interpolation using the amount of whole position offset and the amount of partial position offset.

In the present embodiment, the amount d of whole position offset is equally divided, and the amounts of position offset of the scan region image data Gs2 to Gs7 are corrected. To be specific, the calculator 25 displaces the scan region image data Gsi (where i=1 to 8) in a negative direction of the x axis by (i−1)d/7. The image data after the displacement are shown as scan region image data gs1 to gs8.

The calculator 25 maintains the scan region image data gs1 to gs8 in the storage 24. Further, in the aforementioned description, attention is paid to an amount of offset of the scan image region (the image acquiring region P). However, without being limited thereto, a characteristic shape (a reference pattern) around the image acquiring region P may be determined in advance, an image of the reference pattern may be acquired whenever each scan pattern is scanned and swept, and the amount of offset of the image acquiring region may be determined from an amount of offset of the reference pattern.

Now, the operation of detecting the amount of position offset and the operation of correcting the amount of position offset are completed.

Afterwards, the calculator 25 performs the operation of synthesizing the image (overlapping and integrating the image).

In the operation of synthesizing the image, the calculator 25 synthesizes the scan region image data gs1 to gs8 which the scan region image data Gs1 to Gs8 have been corrected. The scan region image data gs1 to gs8 are image data based on the respective scan region image data Gs1 to Gs8.

The calculator 25 performs calculation by reading and adding image data of a range of each image acquiring region P out of the scan region image data gs1 to gs8 stored in the storage 24. As a result, the calculator 25 generates an image acquiring region image data GP having a size of the image acquiring region P.

The calculator 25 stores the generated image acquiring region image data GP in the storage 24.

Now, the operation of synthesizing the image is completed, and step S3 is completed.

Since the scan region image data gs1 to gs8 are acquired by radiating the ion beam according to an amount D/8 of irradiation of the ion beam, each signal intensity becomes about 1/8, and each SN ratio is low.

However, in the present embodiment, as described above, the deformation of the shape, or the like resulting from the influence of the electrification of the mask 14 is reduced. For this reason, the scan region image data gs1 to gs8 are image data more accurate than an image obtained by performing one scan and sweep with high intensity in relation to positional information.

Further, in the present embodiment, in that the amount of position offset is corrected in the scan region image data gs1 to gs8, the image data that are more accurate in relation to the positional information are added.

These scan region image data are added, and thereby the image acquiring region image data GP becomes a clear image because the same signal intensity as the image obtained by performing one scan and sweep with high intensity is obtained.

Since the synthesized scan region image data gs1 to gs8 are acquired from a plurality of scan directions, when noise caused by the charged electric charges is shown, the shown method differs depending on the scan direction. As a result, since there is no addition like correct image data, the image data becomes low-intensity image data within the image acquiring region image data GP. For this reason, an SN ratio of the image acquiring region image data GP is increased compared to the individual scan region image data.

As the calculation that the calculator 25 performs on the scan region image data, the synthesizing operation based on the addition between the scan region image data has been described by way of example. The calculator 25 may perform another calculation of the scan region image data before it synthesizes the scan region image data. For example, the calculator 25 may perform calculations such as image enhancement processing, averaging processing, noise removal processing, and so on.

Next to step S3, step S4 is performed. This step is a step including an operation (a fourth operation) of displaying the image acquiring region image data GP.

The calculator 25 transmits the image acquiring region image data GP stored in the storage 24 to the display control device 26. The display control device 26 displays the image based on the image acquiring region image data GP on the monitor 19.

Now, step S4 is completed.

An operator determines whether or not there is a defect within the image acquiring region P using the image displayed on the monitor 19, and may initiate a repair operation as needed.

After step S4 is completed, the operator displaces the mask 14 within the XY plane using the sample stage 15, and thereby can acquire an image at another spot of the mask 14 in the same way as described above.

However, the operator is sometimes aware that, in a size range of the image acquiring region P of the mask 14, there is no spot where the edges of the conducting part are fitted to the scan direction. In this case, the operator may omit step S1, and start from step S2.

For example, the edges of the mask pattern of the mask used to fabricate the semiconductor extend in directions perpendicular to each other in most cases. For this reason, for example, in step S1, when the directions of the edges are fitted to the y axis, the directions of the edges are fitted to the x axis at a spot of another mask pattern perpendicular to the y axis, and thus positioning caused by rotation about the Z axis again is not required.

For this reason, since step S1 does need not to be repeated, rapid image acquisition can be performed.

As described above, in the present embodiment, the ion beam is scanned in the direction that obliquely intersects the linear edges in the mask 14, and is also swept a plurality of times with the scan direction changed, and the image data obtained by each scan pattern is integrated. For this reason, when the ion beam passes through the isolated pattern 32, the scan of the ion beam across the long insulating part can be reduced, so that the influence of the electrification can be reduced. As a result, a good image is obtained.

That is, the ion beam is scanned in the direction that obliquely intersects the linear edges. Thereby, even when a scan length of the insulating part is slightly increased in any scan pattern, the scan length of the insulating part may be overwhelmingly shortened in another scan pattern. Thus, it is possible to obtain the image in which the influence of the electrification is greatly reduced by integrating (overlapping) the image obtained by these plurality of scan patterns.

Further, since the amount of irradiation of the ion beam to each scan pattern is small, the image of one scan pattern becomes an image in which the influence of the electrification is low and a stain is little. These images are integrated a plurality of times, and thereby a good quality of image can be acquired.

According to the ion beam apparatus 10 and the method for acquiring the image of the present embodiment using the same, when the image of the dielectric substrate in which the conducting parts, each of which has the linear edges, are formed is acquired using the ion beam, it is possible to easily acquire the image in which the influence of the electrification of the dielectric substrate is reduced.

Further, in the present embodiment, since the scan width (the scan time) of the ion beam in each scan pattern are identical to each other within the scan patterns, the amount of irradiation of the ion beam for each scan line is constant. The amount of electrification per scan line is made constant, and thereby the influence of the charged stain of the mark 14 can be suppressed.

This will be described with reference to FIG. 11.

Figure 11:
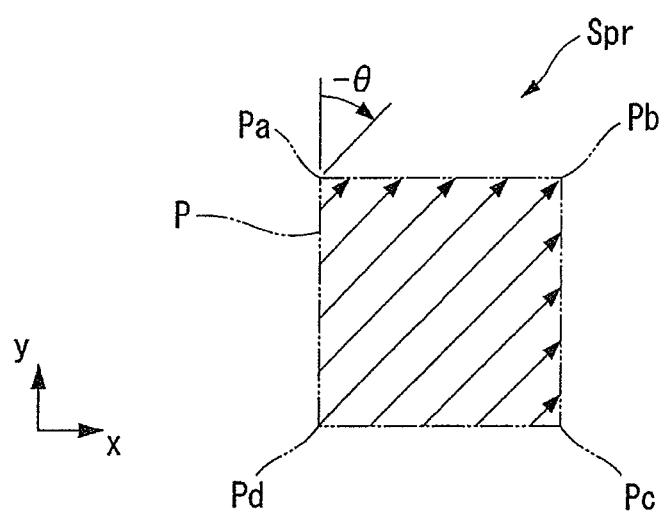
FIG. 11 is a schematic view illustrating an example of a scan pattern of a comparative example.

FIG. 11 is a schematic view illustrating an example of a scan pattern of a comparative example.

A scan pattern Spr of a comparative example illustrated in FIG. 11 is a scan pattern that has the same scan and sweep directions as the scan pattern Sp1 and scans only the inside of an image acquiring region P.

In this scan and sweep method, a scan width (a scan time) of the ion beam differs according to a place. To be specific, a scan width of a scan line passing through points Pb and Pd is longest, and the scan width is more shortened as the scan line passes through a region closer to points Pa and Pc.

When the scan and the sweep are performed on the basis of this scan pattern Spr, a blanking time differs according to the scan line, and thus an amount of electrification differs according to the place. For this reason, a difference (a stain) in brightness of the image occurs around the points Pa and Pc and the points Pb and Pd of the image acquiring region. According to distribution of the amount of electrification, the image may be deformed.

In contrast, in the scan pattern of the present embodiment, since equal-width scan is performed, the blanking time is constant. An image having uniform image brightness according to a sweep place is obtained.

[First Modification]

Next, a method for acquiring an image and an ion beam apparatus of a modification (a first modification) of the present embodiment will be described.

This modification is an example in which the scan pattern is changed in the first embodiment, and is different only in the scan pattern stored in the ion beam irradiation control device 21. Hereinafter, the modification will be described centered on differences from the first embodiment.

Figure 12:
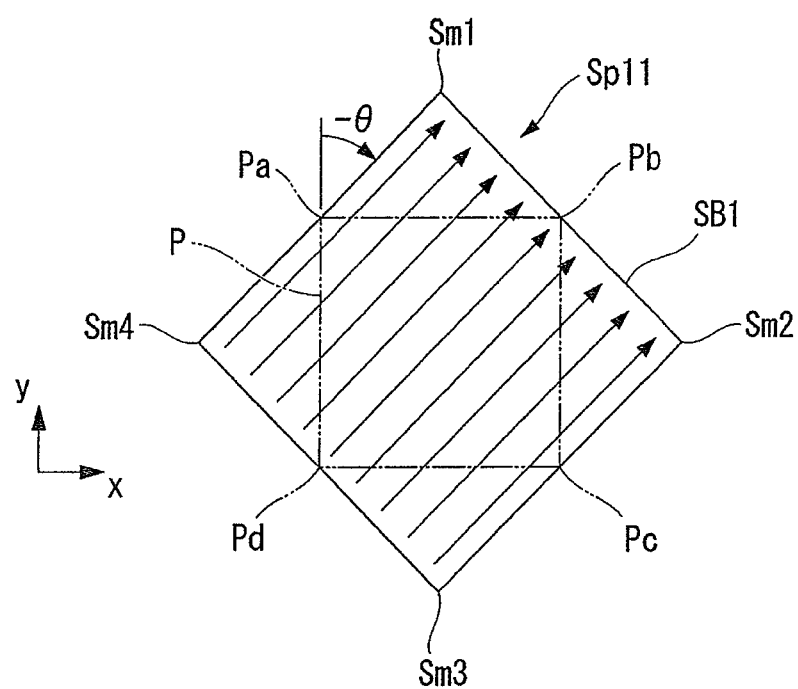
FIG. 12 is a schematic view illustrating an example of a scan pattern in a method for acquiring an image of a modification (a first modification) of the first embodiment of the present invention.

FIG. 12 is a schematic view illustrating an example of a scan pattern in a method for acquiring an image of a modification (a first modification) of the first embodiment of the present invention.

As illustrated in FIG. 12, a scan pattern Sp11 of this modification is scanned and swept on a rectangular scan region SB1 circumscribed around an image acquiring region P.

The scan region SB1 is a rectangle having points Sm1, Sm2, Sm3, and Sm4 as vertexes. A side between the points Sm4 and Sm1 is a segment that passes through a point Pa and is inclined from a y axis by $-\Delta$. A side between the points Sm1 and Sm2 is a segment that is orthogonal to the side between the points Sm4 and Sm1 and passes through a point Pb. A side between the points Sm2 and Sm3 is a segment that is parallel to the side between the points Sm4 and Sm1 and passes through a point Pc. A side between the points Sm3 and Sm4 is a segment that is parallel to the side between the points Sm1 and Sm2 and passes through a point Pd.

A scan direction (see an arrow with a solid line) of the ion beam in the scan pattern Sp11 is a direction directed from the point Sm4 toward the point Sm1.

A sweep direction of the ion beam in the scan pattern Sp11 is a direction that is perpendicular to the scan direction and that is directed from the point Sm1 toward the point Sm2 or from the point Sm2 toward the point Sm1.

A width of each scan line in the scan pattern Sp11 is identical to a length of the side between the points Sm4 and Sm1.

Although illustration of other scan patterns Sp12, Sp13, and Sp14 in the modification is omitted, the other scan patterns are obtained by reversal of the scan direction and symmetrical transformation with respect to the y axis.

For example, the scan pattern Sp12 has the scan direction reversed in the scan region SB1.

For example, the scan pattern Sp13 is a scan pattern that is equivalent to reversing the scan pattern Sp11 to shown left and right (in an x-axial direction). The scan pattern Sp13 is obtained by symmetrical transformation with respect to the y axis.

For example, the scan pattern Sp14 has a scan direction reverse to the scan direction of the scan pattern Sp13.

When the image acquiring region P is a square, and when $\theta=45°$, the scan region SB1 is a square that is a type of the rectangle. A scan region SB2 is homologous to the scan region SB1. At this point, the scan directions of the scan patterns Sp11 and Sp13 are directions directed from the point Sm4 toward the point Sm1, and the scan directions of the scan patterns Sp12 and Sp14 are directions directed from the point Sm2 toward the point Sm1.

According to this modification, except that the scan and the sweep are performed using the scan patterns Sp11 to Sp14 in place of the scan patterns Sp1 to Sp8, this modification is made identical to the first embodiment, and can acquire an image of the image acquiring region P.

Hereinafter, the method for acquiring the image of this modification will be described centered on differences from the first embodiment.

Step S1 of this modification is the same step as step S1 of the first embodiment.

In step S2 of this modification, the ion beam irradiation control device 21 is adapted to control four types of scans and sweeps using the scan patterns Sp11 to Sp14. At this point, an amount of irradiation of the ion beam is set to D/4.

Here, D is an amount of irradiation of ions with which a good image can be acquired by one scan and sweep of the range of the scan region SB1.

In this modification, the scan direction and the sweep direction of the ion beam are orthogonal to each other. For this reason, control of the scan and the sweep in each scan pattern is nearly equal to scan and sweep operations when known raster rotation is performed in the ion beam apparatus.

In step S2 of this modification, as a result of the scan and the sweep in the four types of scan patterns, scan region image data Gs11 to Gs14 corresponding to the scan patterns Sp11 to Sp14 are stored in the storage 24.

Step S3 of this modification is different from that of the first embodiment only in that the operation of detecting the amount of position offset, the operation of correcting the amount of position offset, and the operation of synthesizing the image are performed using the scan region image data Gs11 to Gs14.

That is, scan region image data gs11 to gs14 corrected on the basis of the amounts of position offset of the scan region image data Gs11 to Gs14 are generated. The calculator 25 synthesizes the scan region image data gs11 to gs14 to generate image acquiring region image data GP of the image acquiring region P.

Step S4 of this modification is the same step as step S4 of the first embodiment.

In this modification, a shape of the scan region is a square or a rectangle of a parallelogram by way of example.

With regard to the inside of the image acquiring region P, the scan patterns have only four types, and the scan directions of the edges 30a of the metal line patterns 30 are four directions that are identical and oblique.

For this reason, the modification is made completely identical to the first embodiment, and can reduce a distance at which the ion beam passes through the insulating part when the ion beam passes through the isolated pattern 32.

As a result, when an image of the dielectric substrate in which the conducting parts having the linear edges are formed is acquired using the ion beam, an image in which the influence of electrification of the dielectric substrate is reduced can be easily acquired.

In the scan pattern of the first embodiment, the scan regions outside the image acquiring region P are formed only outside the two sides of the image acquiring region P.

In contrast, in this modification, since the scan direction and the sweep direction are orthogonal to each other, the scan regions outside the image acquiring region P are formed outside the respective sides of the image acquiring region P. A region in which the ion beam is scanned and swept with the same number of sweeps as the inside of the image acquiring region P is generated at each side of the image acquiring region P.

For example, as illustrated in FIG. 12, when the image acquiring region P is a square, and when θ=45°, in this modification, a triangle having the points Sm1, Pa, and Pb outside the image acquiring region P as the vertexes, a triangle having the points Sm2, Pb, and Pc as the vertexes, a triangle having the points Sm3, Pc, and Pd as the vertexes, and a triangle having the points Sm4, Pd, and Pa as the vertexes are isosceles triangles that are congruent to each other.

For this reason, regions of these triangles are subjected to four scans and sweeps of the ion beam in the same way as the inside of the image acquiring region P.

Thus, the outside of the image acquiring region P suffers the same irradiation damage as the inside of the image acquiring region P.

When it is determined that the irradiation damage to the outside of the image acquiring region P is great, as in the first embodiment, it is preferable to obliquely intersect the scan direction and the sweep direction, and to use the parallelogrammic scan pattern in which the sweep direction is parallel to one side of the image acquiring region P.

Second Embodiment

An ion beam apparatus of a second embodiment of the present invention will be described.

Figure 13:
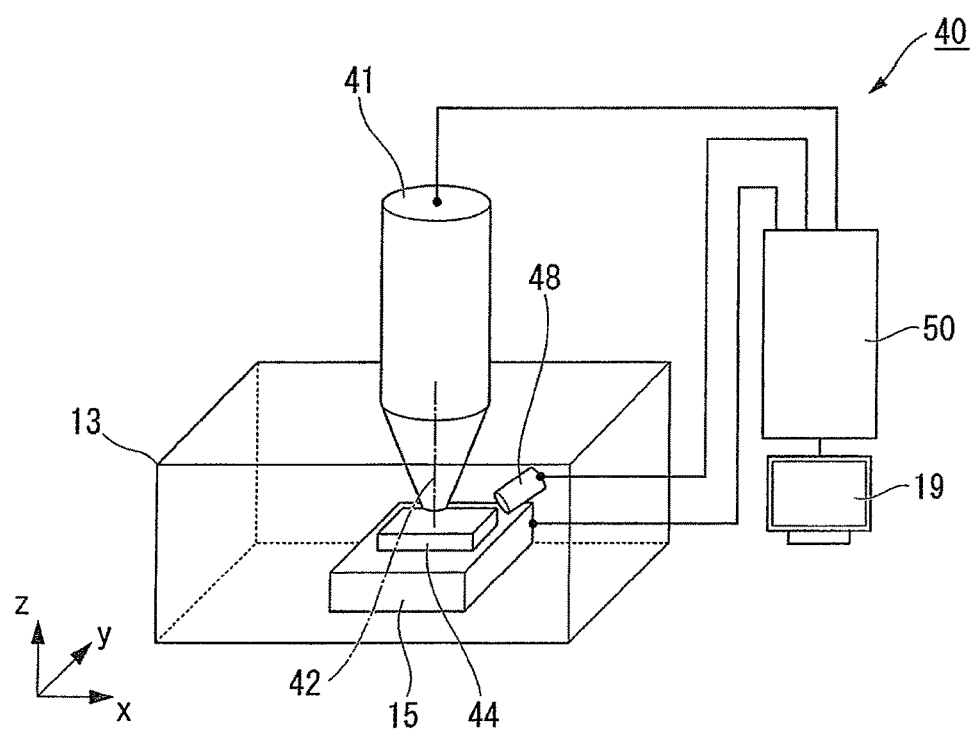
FIG. 13 is a schematic system configuration view illustrating an example of a configuration of an ion beam apparatus of a second embodiment of the present invention.

FIG. 13 is a schematic system configuration view illustrating an example of a configuration of the ion beam apparatus of the second embodiment of the present invention.

The ion beam apparatus 40 of the present embodiment illustrated in FIG. 13 is an apparatus for performing only both observation of a sample 44 using an ion beam and a sputtering process caused by irradiation of the ion beam. The sample 44 is not limited to the mask in the first embodiment. However, a sample in which an insulating part and conducting parts are mixed is suitable, and the sputtering process caused by the irradiation of the ion beam refers to a process of forming a cross section of the sample 44, or the like.

The ion beam apparatus 40 is provided with an ion beam column 41, a detector 48, and a control device 50 in place of the ion beam column 11, the detector 18, and the control device 20, and dispenses with the etching gas feeder 16 and the deposition gas feeder 17 of the ion beam apparatus 10 of the first embodiment.

Hereinafter, the second embodiment will be described centered on differences from the first embodiment.

The ion beam column 41 does not perform a repair operation.

The detector 48 detects secondary charged particles based on the ion beam radiated to the sample 44 from the ion beam column 41.

As the secondary charged particles, the detector 48 detects, for instance, secondary ions, secondary electrons, etc. generated from the sample 44.

In association with the removal of the etching gas feeder 16 and the deposition gas feeder 17, the control device 50 is configured by removing a function of controlling these feeders from the control device 20 of the first embodiment.

For this reason, although detailed illustration is omitted, the control device 50 is provided with an ion beam irradiation control device 21, an image data generator 23, a storage 24, a calculator 25, and a display control device 26, which are the same as the first embodiment.

The control device 50 according to the present embodiment perform the same operation as the control device 20 according to the first embodiment except that the repair operation is not performed.

According to the ion beam apparatus 40 of the present embodiment, the second embodiment is made identical to the first embodiment, and an image of an image acquiring region P in a sample 44 can be acquired.

According to the ion beam apparatus 40 of the present embodiment, the second embodiment is made identical to the first embodiment, and steps S1 to S4 can be performed.

For this reason, when the ion beam apparatus 40 is made identical to that of the first embodiment, and when it acquires an image of a dielectric substrate in which the conducting parts having the linear edges are formed using the ion beam, the ion beam apparatus 40 can easily acquire an image in which the influence of electrification of the dielectric substrate is reduced.

Further, in the description of each of the embodiments and the first modification, the case in which the image of the image acquiring region is acquired by radiating the plurality of ion beams in the scan direction or the sweep direction within the scan region by means of the plurality of scan patterns has been described by way of example. The four or eight types of scan patterns are exemplified, but the number of scan patterns is not limited thereto.

The number of scan patterns may be one. For example, an image that is not influenced by the charged electric charges may be acquired depending on the type of the mask pattern of the mask 14 even when the plurality of scan region image data in which the scan direction of the ion beam or the scan region is changed are not acquired. In this case, it is not essential to acquire the plurality of scan region image data.

In this case, in the third operation, the image data of the image acquiring region may be generated only by the calculation of extracting the image data within the image acquiring region from one scan region image data.

In the description of the first modification, the case in which the total of four scans and sweeps are performed one by one by the scan patterns Sp11 to Sp14 has been described by way of example. However, the scan region image data may be generated by performing a plurality of scans and sweeps by means of the same scan pattern. In this case, the same number of scans and sweeps is performed on each scan pattern, which is preferable in obtaining a good image.

For example, in the first modification, the image acquiring region image data may be generated by performing the two scans and sweeps on the scan patterns Sp11 to Sp14 and performing image processing on the basis of the total of eight scan region image data. However, in this case, the amount of irradiation of the ion beam in the one scan and sweep is set to be D/8.

In the description of each of the embodiments and the first modification, the case in which the shape of the scan region of the scan pattern abuts the sides or the apexes of the image acquiring region has been described by way of example. However, the shape of the scan region may be a shape within which the image acquiring region is included without abutting the image acquiring region.

In the description of each of the embodiments and the first modification, the case in which, before the operation of synthesizing the image (the third operation) is performed, the operation of detecting the amount of position offset (the fifth operation) and the operation of correcting the amount of position offset (the sixth operation) are performed has been described by way of example. However, when it is known that the amount d of whole position offset of the image data is small, for instance, when the mask 14 is hardly charged, the fifth operation and the sixth operation may be omitted.

In this case, the scan region image data synthesized by the third operation is based on the scan region image data itself generated by the second operation.

Although the preferred embodiments of the present invention have been disclosed, the present invention is not limited to these embodiments and their modifications. Additions, omissions, and substitutions of the configuration and modifications thereof are possible without departing from the scope and spirit of the invention.

Further, the present invention is not limited by the above description, and is defined by the accompanying claims.

What is claimed is:

1. A method of acquiring an image of an image acquiring region of a sample, comprising:
   a first step of irradiating and scanning an ion beam in a first scan pattern on a first scan region of a sample, the scan region including therein the image acquiring region;
   a second step of detecting secondary charged particles generated by irradiating and scanning the ion beam on the first scan region of the sample and generating first image data of the image acquiring region;
   repeating the first and second steps a plurality of times using different scan patterns on different scan regions that differ from the first scan and the first scan region and from one another, each of the different scan regions including therein the image acquiring region, and generating a plurality of image data of the image acquiring region;
   generating image data of the image acquiring region by synthesizing all the image data generated by scanning the different scan regions; and
   displaying the synthesized image data of the image acquiring region,
   wherein the scan patterns differ from one another by having different scan directions of the ion beam.

2. The method according to claim 1; wherein each of the different scan regions has a parallelogram shape.

3. The method according to claim 1; wherein the scan patterns differ from one another by having different sweep directions of the ion beam.

4. The method according to claim 2; wherein the scan patterns differ from one another by having different sweep directions of the ion beam.

5. The method according to claim 2; further comprising, before synthesizing the same data,
   detecting an amount of position offset between the image data in the first scan region and the image data in the last scan region; and
   correcting the amount of position offset of the image data in the plurality of the scan regions on the basis of the detected amount of position offset.

6. The method according to claim 1; further comprising, before synthesizing the same data,
   detecting an amount of position offset between the image data in the first scan region and the image data in the last scan region; and
   correcting the amount of position offset of the image data in the plurality of the scan regions on the basis of the detected amount of position offset.

* * * * *